US012799638B2

(12) United States Patent
Tanaka et al.

(10) Patent No.: US 12,799,638 B2
(45) Date of Patent: Nov. 17, 2026

(54) COMPOSITE FIBER

(71) Applicant: Murata Manufacturing Co., Ltd., Nagaokakyo (JP)

(72) Inventors: Kou Tanaka, Nagaokakyo (JP); Takashi Tateishi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 604 days.

(21) Appl. No.: 17/964,218

(22) Filed: Oct. 12, 2022

(65) Prior Publication Data

US 2023/0108611 A1 Apr. 6, 2023

(30) Foreign Application Priority Data

Sep. 24, 2021 (JP) ................................ 2021-155716

(51) Int. Cl.

| | |
|---|---|
| ***D01F 8/18*** | (2006.01) |
| ***H10N 30/00*** | (2023.01) |
| ***H10N 30/853*** | (2023.01) |

(52) U.S. Cl.

CPC ............ *D01F 8/18* (2013.01); *H10N 30/702* (2024.05); *H10N 30/8536* (2023.02); *D10B 2101/08* (2013.01); *D10B 2101/12* (2013.01); *D10B 2401/063* (2013.01); *D10B 2505/00* (2013.01)

(58) Field of Classification Search

None

See application file for complete search history.

(56) References Cited

U.S. PATENT DOCUMENTS

| | | | | |
|---|---|---|---|---|
| 4,068,037 A * | 1/1978 | Debolt | D01F 8/18 | 427/373 |
| 5,705,122 A * | 1/1998 | Curran | D01F 9/08 | 264/626 |
| 5,792,416 A * | 8/1998 | Sacks | C04B 35/571 | 264/627 |
| 2005/0236809 A1 | 10/2005 | Haneda et al. | | |
| 2015/0004393 A1 * | 1/2015 | Pegna | C04B 35/565 | 501/95.2 |

FOREIGN PATENT DOCUMENTS

| | | | |
|---|---|---|---|
| CN | 103898632 | * | 7/2014 |
| JP | H08188926 | * | 7/1996 |

(Continued)

OTHER PUBLICATIONS

Machine Translation of JPH08188926 (Year: 1996).*

(Continued)

*Primary Examiner* — Shawn Mckinnon

(74) *Attorney, Agent, or Firm* — ArentFox Schiff LLP

(57) ABSTRACT

The present invention can provide a fiber having a further enhanced strength while serving as a ceramic fiber. To this end, a composite fiber according to the present invention a first fiber component member made of a material having a volume resistivity of $5\times10^{-6}$ to $5\times10^{6}\Omega\cdot m$, or a material of a semiconductor or metalloid; and a second fiber component member comprising a ceramic material, wherein the first fiber component member and the second fiber component member are adjacent to each other such that the first and second fiber component members form a fibrous body.

9 Claims, 12 Drawing Sheets

(56) References Cited

FOREIGN PATENT DOCUMENTS

| | | | |
|---|---|---|---|
| JP | H0931756 | * | 2/1997 |
| JP | 2003012829 | A | 1/2003 |
| JP | 2004015489 | A | 1/2004 |
| JP | 2005059552 | A | 3/2005 |
| JP | 2005171752 | A | 6/2005 |
| JP | 2005313715 | A | 11/2005 |
| JP | 2010198092 | A | 9/2010 |
| JP | 2018138710 | A | 9/2018 |

OTHER PUBLICATIONS

Machine Translation of CN103898632 (Year: 2014).*
Machine Translation of JPH0931756 (Year: 1997).*
Sato, Hiroshi; "Development of Fiber-Shaped Devices and Their Applications to Composite Materials"; Polymers, July Issue, The Society of Polymer Science, Japan, vol. 57, No. 7, 2008, pp. 506-509.

* cited by examiner 50
51
52
53
D
D'
Dd
40
41
42
C
C'
Dc
30
31
32a
32b
B
B'
Db
20
21
22
A
A'
Da

COMPOSITE FIBER

CROSS REFERENCE TO RELATED APPLICATION

The present application claims the benefit of priority under the Paris Convention based on Japanese Patent Application No. 2021-155716 (Filing Date: Sep. 24, 2021, Title of Invention: "COMPOSITE FIBER"), the disclosure of which is hereby incorporated by reference as if set forth in its entirety.

THE FIELD OF THE INVENTION

The present invention relates to a composite fiber. More particularly, the present invention relates to a composite fiber composed of at least two fiber component members.

BACKGROUND OF THE INVENTION

Piezoelectric fibers using a lead zirconate titanate fiber (hereinafter also referred to as "PZT fiber") are known as vibration sensors and actuators which are utilizable for structures such as buildings, automobiles, ships, and aircrafts. For example, see Patent Document 1: Japanese Patent Application No. 2003-12829, Patent Document 2: Japanese Patent Application No. 2005-171752, Patent Document 3: Japanese Patent Application No. 2004-15489, Patent Document 4: Japanese Patent Application No. 2005-59552, Patent Document 5: Japanese Patent Application No. 2005-313715, and Patent Document 6: Japanese Patent Application No. 2010-198092. A smart board is also known where the PZT fiber is embedded in a structure thereof in order for the PZT fiber to function as a stress sensor, a vibration sensor or an actuator. See the above Patent Document 1, for example.

SUMMARY OF THE INVENTION

The inventors of the present application have noticed that there are still problems to be overcome with the conventional lead zirconate titanate fiber (PZT fiber) provided as a ceramic fiber including a ceramic member, and thus have found out the need to take measures therefor. Specifically, the inventors of the present application have found the following problems.

The PZT fiber 100 of Patent Document 1 or the like has a PZT thin layer 102 formed by coating a metal wire 101 (a thin metal wire such as a titanium wire or a platinum wire) with a lead zirconate titanate crystal (a PZT crystal) as illustrated in FIG. 11A, for example.

Such PZT fiber is produced by growing the PZT crystal on the surface of the metal wire by, for example, a hydrothermal synthesis method. Alternatively, the PZT fiber is produced by using an extrusion forming method. For example, in the extrusion forming method as illustrated in FIG. 12, a PZT paste 105 (a mixture prepared by blending and kneading a PZT powder, a binder and water, optionally with an organic solvent and various molding additives) is extruded simultaneously together with the metal wire 101 to produce a molded PZT fiber article having a metal core therein, and thereafter the molded PZT fiber article is heated to undergo a debindering process. Subsequently, the molded PZT fiber article is sintered at a higher temperature, and thereby there can be finally provided a PZT fiber in which a PZT thin layer is provided on the surface of the metal wire.

Such conventional PZT fiber is not necessarily sufficient especially in terms of its strength. Thus, in a case where the PZT fiber is used for a vibration sensor, an actuator or the like for example, the PZT fibers 100 have to be partially embedded and reinforced in a structure 202 having a stacking of CFRP prepregs 201 in order to allow the structure to be used as a smart board 200 (see FIGS. 11B and 11C).

For example, in a case of the smart board 200 used as a vibration sensor or an actuator, the PZT fiber 100 corresponds to a piezoelectric material, and thus a potential is generated upon the detection of the vibration. This allows the smart board to function as the sensor. Conversely, when a potential is applied to the PZT fiber 100, the PZT fiber expands and contracts or vibrates according to the potential, which allows the smart board to function as the actuator. For example, when the PZT fiber 100 becomes extended along an axial direction indicated by an arrow as illustrated in FIG. 13A due to the application of the potential, the PZT fiber can be curved together with the structure 202 as illustrated in FIG. 13B. As such, a predetermined PZT fiber among a plurality of PZT fibers 100 in the smart board 200 can function as a sensor and detect the vibration, and another predetermined PZT fiber among them in the smart board 200 can serve as an actuator so as to control (dampen) the vibration. In FIGS. 13A and 13B, a lower portion of each PZT fiber 100 has been embedded in the structure 202, more specifically into the CFRP prepreg 201 (see FIG. 11C).

When a ceramic fiber is used as a piezoelectric fiber or the like, the strength is required for such fiber. In this regard, the inventors of the present application have found that the strength (e.g., a tensile strength or an elongation load at break) of the conventional PZT fibers is about 4 $kgf/mm^2$ according to the contents of "POLYMERS" July issue (Vol. 57, No. 7, 2008) by The Society of Polymer Science, Japan, and that such strength is still insufficient as a fiber, requiring a further improvement in strength of the fiber.

In consideration of the above challenge, the present invention has been created. That is, a main object of the present invention is to provide a fiber having a further enhanced strength even while serving as a ceramic fiber.

The inventors of this application have attempted to address the challenge described above, from a novel standpoint rather than a continual standpoint of the conventional art. As a result, the inventors of this application have created a composite fiber that is capable of attaining the main object described above.

The present invention provides a composite fiber including a first fiber component member made of a material having a volume resistivity of $5\times10^{-6}$ to $5\times10^{6}$ Ω·m and a second fiber component member including a ceramic material, wherein the first fiber component member and the second fiber component member are adjacent to each other such that the first and second fiber component members form a fibrous body.

According to another embodiment of the present invention, there is also provided a composite fiber including a first fiber component member including a material of a semiconductor or metalloid and a second fiber component member including a ceramic material, wherein the first fiber component member and the second fiber component member are adjacent to each other such that the first and second fiber component members form a fibrous body.

The composite fiber according to the present invention can be a fiber having the further enhanced strength even while serving as a ceramic fiber.

For example, the composite fiber according to the present invention is preferably a fiber having a higher strength than that of the conventional PZT fiber.

It should be noted that the effects described in the present specification are merely examples and are not limited thereto, and thus additional effects may be provided.

BRIEF DESCRIPTION OF THE DRAWINGS

(FIG. 1A: a perspective view, FIG. 1B: a cross-sectional view, FIG. 1C: a side cross-sectional view).

(FIG. 3A: a partially cutaway perspective view, FIG. 3B: a cross-sectional view).

(FIG. 4A: a partially cutaway perspective view, FIG. 4B: a cross-sectional view).

(FIG. 5A: a partially cutaway perspective view, FIG. 5B: a cross-sectional view).

(FIG. 6A: a partially cutaway perspective view, FIG. 6B: a cross-sectional view).

(FIG. 8A: a concentric structure, FIG. 8B: a partially cutaway structure of an outer portion, FIG. 8C: a half cutaway structure of an outer portion, FIG. 8D: a structure of an additional intermediate layer).

DETAILED DESCRIPTION OF THE EMBODIMENT(S) OF THE INVENTION

Figure 1A:
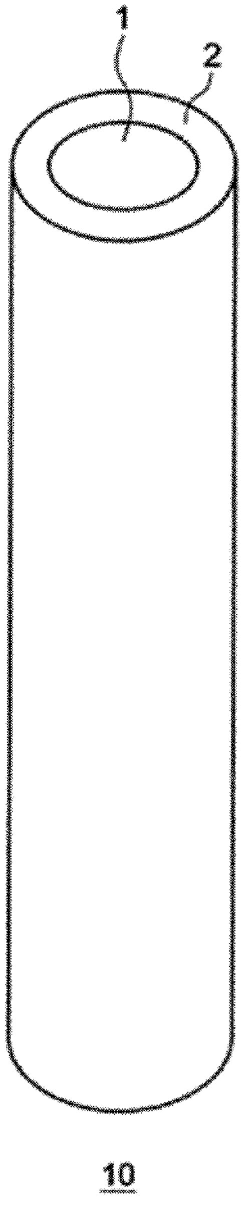
FIGS. 1A to 1C are schematic views schematically illustrating a composite fiber according to an embodiment of the present invention

Hereinafter, a composite fiber will be described in more detail according to an embodiment of the present invention.

The description will be made with reference to the drawings as necessary. In the drawings, various elements of the present invention are schematically exemplified for the understanding of a composite fiber according to the present invention, and thus they can be different from actual ones in terms of, for example, outer appearance and dimensional ratio.

The directions of "upper" and "lower" (vertical direction), and also "rightward" and "leftward" (horizontal direction), which are directly or indirectly used herein, are ones based on the drawings. In addition, the "cross-sectional view", which is also directly or indirectly used herein, is typically based on the fiber's cross section taken along a plane having a normal line in an axial direction of the fiber. Unless otherwise specified, the same or similar reference numerals can indicate the same or similar member or portion, or can have the same or similar meaning or contents.

Numerical ranges as used herein are meant to include the lower and upper limits themselves, unless otherwise specified such as "less than/lower than" or "more than/greater than/higher than". That is, taking the numerical range of 1 to 10 just as an example, it can be interpreted as including the lower limit value of "1" and the upper limit value of "10".

Further, the fiber described in the present specification can be called "SENI" in Japanese, and thus the present invention can also relate to a composite "SENI".

In a broad sense, the term "composite fiber" according to the present invention means a fiber composed of materials different from each other. That is, the composite fiber of the present invention is typically a fiber in which fiber component members made of different materials from each other are integrated with each other. In a broad sense, the term "fiber" or "fibrous body" means an elongated article having a length dimension of 10 times or more, 100 times or more, or the like the cross-sectional dimension thereof, but is not necessarily limited thereto wherein the length dimension and the cross-sectional dimension may be arbitrarily chosen. In a narrow sense, the term "fiber" or "fibrous body" has dimensions corresponding to those of a so-called "fiber", "microfiber", "nanofiber" or the like. Therefore, the cross-sectional dimension of the composite fiber according to the present invention may have, for example, the millimeter order, the micrometer order, the nanometer order, or the like. There is no particular limitation on the shape of the "fiber". For example, the cross-sectional view of the composite fiber may typically have a circular shape, an elliptical shape, a rectangular shape, or the like, but is not necessarily limited thereto. The composite fiber may have an overall cross-sectional profile that is arbitrarily formed from a straight line, a curve, and/or a combination thereof.

The composite fiber of the present invention is at least characterized by being a ceramic fiber composed of a "material having a volume resistivity of $5\times10^{-6}$ to $5\times10^{6}$ Ω·m" and a "ceramic material". That is, the composite fiber of the present invention is a fiber constituted to include a ceramic member wherein such ceramic member is composited with a "material having a volume resistivity of $5\times10^{-6}$ to $5\times10^{6}$ Ω·m". The term "ceramic" as used herein can also be referred to as a "ceramics".

More specifically, the composite fiber according to the present invention is composed of fiber component members of at least two different materials from each other, and preferably comprises a first fiber component member made of a material having a volume resistivity of $5\times10^{-6}$ to $5\times10^{6}$ Ω·m and a second fiber component member made of a ceramic material. In other words, in a preferred embodiment, the "material having a volume resistivity of $5\times10^{-6}$ to $5\times10^{6}$ Ω·m” of the first fiber component member and the “ceramic material” of the second fiber component member are combined with each other to form a fibrous body of the composite fiber.

The term “fiber component member” as used herein means, in a broad sense, one element constituting a fibrous body or a fiber. In a narrow sense, the term “fiber component member” means a portion that occupies at least a part of a fibrous body/fiber from which a form of a fibrous body/fiber, or such thin or ultrathin elongated shape is provided.

The composite fiber according to the present invention can also be expressed from another point of view. Specifically, the composite fiber, which is composed of fiber component members of at least two different materials from each other, comprises a first fiber component member including a semiconductor or metalloid material and a second fiber component member including a ceramic material. That is, the “semiconductor or metalloid material” of the first fiber component member (hereinafter, also referred to as a “semiconductor/metalloid material”) and the “ceramic” of the second fiber component member are combined with each other to form a fibrous body of the composite fiber.

In the composite fiber according to the present invention, the first fiber component member and the second fiber component member adjoin to each other, and thereby forming a fibrous body. For example, the first fiber component member and the second fiber component member are adjacent to each other in a cross-sectional view taken along a plane having its normal line in the axial direction of the fiber. Preferably, the first fiber component member and the second fiber component member are integrated with each other to form a single fiber.

Figure 1B:
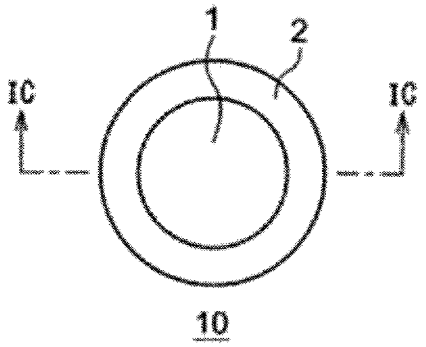
Figure 1C:
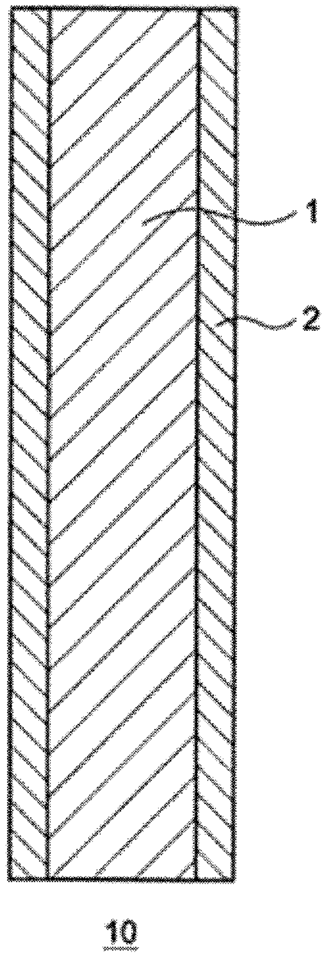

One example of the composite fiber according to the present invention is illustrated in FIGS. 1A to 1C. FIG. 1A is a perspective view of the composite fiber 10 as an example. FIG. 1B schematically illustrates a cross section of the composite fiber 10 of FIG. 1A (particularly a cross section taken along a direction perpendicular to the axial direction of the fiber), and FIG. 1C schematically illustrates a cross section in the IC-IC of FIG. 1B (particularly a side cross section taken along the axial direction of the fiber).

The composite fiber 10 of the present invention is composed of a first fiber component member 1 and a second fiber component member 2. As illustrated in drawings, the first fiber component member 1 and the second fiber component member 2 are adjacent to each other such that a fibrous body of the composite fiber is provided by the first and second fiber component members. That is, the first fiber component member 1 having a volume resistivity of $5\times10^{-6}$ Ω·m to $5\times10^{6}$ Ω·m and the second fiber component member 2 including a ceramic are integrally combined with each other to take a fiber shape, thereby providing the composite fiber 10. The volume resistivity of the first fiber component member may be, for example, $1.0\times10^{-5}$ to $1.0\times10^{6}$ Ω·m, or $5\times10^{-5}$ to $5\times10^{5}$ Ω·m. As can be seen from such descriptions, the expression “are adjacent to each other”/“to adjoin to each other” as used herein preferably means an arrangement of being positioned adjacent to or in contact with each other, and thereby forming a fiber. For example, the first fiber component member and the second fiber component member may be in close contact with each other to give an interface therebetween in a cross-sectional view of the fiber.

The term “volume resistivity” as used herein refers to a resistivity under a temperature of 23±5° C. and a relative humidity of 50±20% as temperature and humidity conditions. The volume resistivity can be measured in accordance with JIS R 7609: 2007. The volume resistivity may be a value measured through extracting or taking out only the first fiber component member from the composite fiber. In a simple manner, the volume resistivity may be one determined as a material before being composited into a fiber.

When the first fiber component member constituting the fibrous body has a volume resistivity of $5\times10^{-6}$ to $5\times10^{6}$ Ω·m, the first fiber component member preferably corresponds to a member including a semiconductor or metalloid material. Here, assuming a case where the first fiber component member is constituted of a metal material which is lower in volume resistivity than that of the semiconductor/metalloid, the first fiber component member can be based on a metal bonding. On the other hand, when the first fiber component member is constituted of the semiconductor or metalloid material according to the present invention, the first fiber component member can be a member based on a covalent bonding. Accordingly, the first fiber component member including the material having the volume resistivity of $5\times10^{6}$ to $5\times10^{6}$ Ω·m or including the semiconductor/metalloid material is relatively high in its tensile strength (that is, has a larger tensile strength than that of a metal member such as Ti), and can lead to a further enhanced strength of the fiber. As such, the fiber according to the present invention, which can correspond to a ceramic fiber, can be used as a piezoelectric fiber while having the further enhanced strength therein.

In a preferred embodiment, the first fiber component member including such material having the volume resistivity of $5\times10^{-6}$ to $5\times10^{6}$ Ω·m or the semiconductor/metalloid material has a relatively high elastic modulus. This means that the higher elastic modulus can be given in the present invention than that in the case of the first fiber component member made of metal other than the semiconductor/metalloid. Therefore, when a force is applied to the composite fiber of the present invention, the first fiber component member can effectively take charge of the force. Preferably, when an external force is applied to the composite fiber for generating a piezoelectric effect, the first fiber component member can effectively receive and bear the stress to be applied. Therefore, an undesirable stress is less likely to be caused in the second fiber component member made of the ceramic, which allows the composite fiber of the present invention to be provided as a piezoelectric fiber that is less prone to fracture with high strength (i.e., as a fracture-proof high-strength piezoelectric fiber).

From such point of view, the composite fiber according to the present invention can exhibit a higher strength and/or a higher elasticity, which facilitates achieving a reduction in fiber diameter. The composite fiber of the present invention, which can have a reduced diameter (namely, a small cross-sectional dimension of the fiber), can be more suitably used as a piezoelectric fiber. For example, the composite fiber of the present invention can be provided as a fiber capable of gaining a fine input sensing and a drive output.

The term “semiconductor” as used herein means, in a broad sense, a material belonging to one between a good conductor (e.g., metal) and an insulator (e.g., resin or glass). For example, the term “semiconductor” refers to a material whose electric conductivity, resistivity or the like has a value between those of the “good conductor such as metal” and the “insulator such as resin or glass”.

In the present invention, there is no particular limitation on the type of the semiconductor of the first fiber component member, and it may be any of an element semiconductor (or a simple substance semiconductor), a compound semiconductor, an oxide semiconductor, or an organic semiconductor from the perspective of constituent elements. Further, the semiconductor may be an intrinsic semiconductor corresponding to a high-purity semiconductor material, or an impurity semiconductor to which impurities or the like has been added. Furthermore, from the perspective of carrier, the semiconductor of the first fiber component member may be an N-type semiconductor or a P-type semiconductor.

As an example, the constituent (constituent element) of the semiconductor in the first fiber component member may be at least one element selected from the group consisting of carbon (C), silicon (Si), germanium (Ge), gallium (Ga), arsenic (As), indium (In), phosphorus (P), antimony (Sb), aluminum (Al), nitrogen (N), and the like.

The term "metalloid" as used herein means a material whose chemical and physical characteristics are intermediate between those of a metal and a non-metal, or a material which can serve as a combined material of a metal and a non-metal. The metalloid may also be a so-called "half metal"/"semimetal". By way of example only, the metalloid element in the first fiber component member may be at least one element selected from the group consisting of silicon (Si), germanium (Ge), boron (B), arsenic (As), antimony (Sb), tellurium (Te), and astatine (At). As can be seen from the above description, the "metalloid" and the "semiconductor" may be interchangeable with each other in the present specification, while depending on the type of specific element. That is, the material of the first fiber component member according to the present invention may be included in the category of metalloids while being included in the category of semiconductors, and vice versa.

In the composite fiber according to the present invention, the first fiber component member and the second fiber component member may be adjacent to each other such that one of the first fiber component member and the second fiber component member is situated outside the other thereof. For example, as illustrated in FIGS. 1A to 1C, the first fiber component member 1 and the second fiber component member 2 may be adjacent to each other with the second fiber component member 2 being positioned relatively outside the first fiber component member 1. Alternatively, the first fiber component member 1 and the second fiber component member 2 may be conversely positioned. That is, the first fiber component member may be positioned relatively outside the second fiber component member such that they adjoin to each other. In any embodiment, the composite fiber according to the present invention can be provided as a fiber having an enhanced strength due to the first fiber component member having the relatively high tensile strength and/or the relatively high elastic modulus compared with that (those) of the second fiber component member. The first fiber component member and/or the second fiber component member may have an extending form that extends along the axial direction of the composite fiber. In one embodiment, both the first fiber component member and the second fiber component member extend along the axial direction of the composite fiber. For example, the first, fiber component member and the second fiber component member may extend side by side with each other or in parallel with each other along the axial direction of the fiber.

When the "second fiber component member including a ceramic" is situated outside the "first fiber component member including a material having a volume resistivity of $5\times10^{-6}$ to $5\times10^{6}$ Ω·m or a semiconductor/metalloid", the composite fiber of the present invention may be used such that the first fiber component member positioned relatively inside of the composite fiber can serve for an electrical connection. In this case, the second fiber component member situated relatively outside of the composite fiber may also serve for an electrical connection such that a piezoelectric effect associated with the second fiber component member including the ceramic is generated. Alternatively, when the "first fiber component member including a material having a volume resistivity of $5\times10^{-6}$ to $5\times10^{6}$ Ω·m or a semiconductor/metalloid" is situated outside the "second fiber component member including a ceramic", the composite fiber of the present invention may be used such that the first fiber component member positioned relatively outside of the composite fiber can serve for an electrical connection. Similarly, the second fiber component member positioned relatively inside of the composite fiber may also serve for an electrical connection such that a piezoelectric effect associated with the second fiber component member including the ceramic is generated. In this way, the composite fiber of the present invention can be more suitably used as a piezoelectric fiber.

The first fiber component member 1 is not necessarily limited to a single member in the composite fiber. That is, the first fiber component member may be composed of a plurality of sub-fiber component members. For example, the first fiber component member may be composed of at least two fibrous members. Such plurality of the sub-fiber component members allow the first fiber component member to have more effective action of receiving and bearing the stress to be applied, which can facilitate providing the composite fiber of the present invention as a fiber having a higher strength. There is no particular limitation on the number of the sub-fiber component members. For example, the number of the sub-fiber component members may be 2 to 50, 2 to 40, 2 to 30, 2 to 20, or 2 to 10 per one composite fiber.

Figure 2:
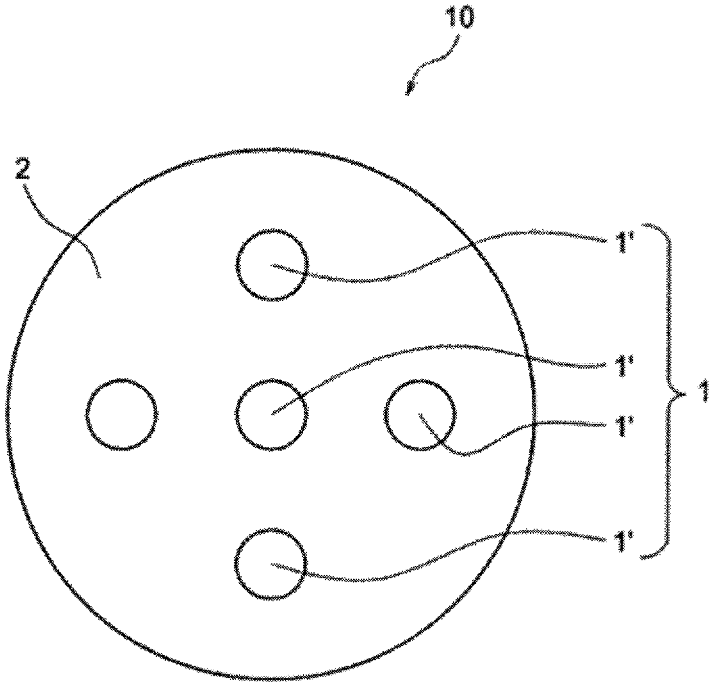
FIG. 2 is a cross-sectional view schematically illustrating a composite fiber according to an embodiment of the present invention, which also illustrates an embodiment wherein a plurality of sub-fiber component members are provided as the first fiber component member.

For example, in a cross-sectional view as illustrated in FIG. 2, a plurality of sub-fiber component members 1' as the first fiber component member 1 may be disposed within a contour region of the second fiber component member 2. This means that the sub-fibrous materials 1' of the first fiber component member 1 (hereinafter, also referred to as a "first sub-fibrous materials") are positioned in the fiber region given by the second fiber component member 2 of the composite fiber 10. In this case, the plurality of first sub-fibrous materials in the interior of the fiber can cooperatively receive and bear the stress to be applied, which can facilitate giving the higher strength of the composite fiber.

In the cross-sectional view of the composite fiber, the plurality of first sub-fibrous materials may be disposed symmetrically to each other. For example, as illustrated in FIG. 2, the plurality of first sub-fibrous materials 1' may be disposed within the contour region of the second fiber component member 2 such that the plurality of first sub-fibrous materials 1' have a symmetrical relationship (e.g., a point symmetrical or line symmetrical relationship) with each other. In such symmetrical arrangement, the first sub-fibrous materials can have more effective action of receiving and bearing the stress to be applied. The plurality of first sub-fibrous materials may extend along the axial direction of the composite fiber. For example, the plurality of first sub-fibrous materials may extend side by side with each other or in parallel with each other along the axial direction of the fiber.

As described above, the first fiber component member is preferably a fiber member having a relatively high tensile strength, compared with that of the second fiber component member. For example, the tensile strength of the first fiber component member may be 100 $kgf/mm^2$ or more. That is, the first fiber component member, which is combined with the second fiber component member made of the ceramic in the composite fiber, has the material of a tensile strength of 100 kgf/$mm^2$ or more, for example. Such tensile strength can effectively contribute to reducing or preventing the undesirable stress that may be caused in the second fiber component member made of the ceramic, which can facilitate making it possible for the composite fiber of the present invention to be provided as a piezoelectric fiber that is hard to fracture (or break) with high strength.

In a preferred embodiment, the tensile strength of the first fiber component member is 200 kgf/$mm^2$ or more. That is, the "first fiber component member having a volume resistivity of $5\times10^{-6}$ to $5\times10^{6}$ Ω·m or a semiconductor/metalloid material", which is combined with the second fiber component member made of the ceramic in the composite fiber, has the tensile strength of, for example, 200 kgf/$mm^2$ or more, which can more effectively contribute to a realization of the fracture-proof piezoelectric fiber having a higher strength. There is no particular limitation on the upper limit of the tensile strength of the first fiber component member. For example, the upper limit of the tensile strength of the first fiber component member may be 20000 kgf/$mm^2$, 10000 kgf/$mm^2$, 5000 kgf/$mm^2$, 2500 kgf/$mm^2$, 2000 kgf/$mm^2$, 1000 kgf/$mm^2$, 800 kgf/$mm^2$, or 500 kgf/$mm^2$.

The term "tensile strength" as used herein refers to a strength determined by using a tensile tester for a test piece prepared in accordance with JIS R 7606: 2000. For convenience, a value measured using a strength tester (MST-1 manufactured by Shimadzu Corporation) may be adopted as the "tensile strength".

The composite fiber according to the present invention, which comprises the first fiber component member constituted of the material having a volume resistivity of $5\times10^{-6}$ to $5\times10^{6}$ Ω·m or the semiconductor/metalloid material, can provide an advantageous effect in terms of, for example, electrical properties and/or a production process of the composite fiber due to the presence of such first fiber component member.

For example, the resistivity can be adjusted due to an element doping and/or a defect formation of the semiconductor/metalloid of the first fiber component member, and a desired voltage can be brought about in a ceramic portion of the second fiber component member which is in contact with the first fiber component member. That is, the first fiber component member may be an at least partially doped member, and thereby making it possible for the composite fiber of the present invention to be provided as a more suitable piezoelectric fiber in terms of the voltage application. The resistivity can also be adjusted by a pattern of the first fiber component member (e.g., the semiconductor/metalloid pattern), and thereby making it possible for the composite fiber of the present invention to become more suitable in terms of the voltage application.

In a preferred embodiment, the material of the first fiber component member is constituted of a carbon and/or a silicon. That is, the material having the volume resistivity of $5\times10^{-6}$ to $5\times10^{6}$ Ω·m or the semiconductor/metalloid material in the first fiber component member may comprise at least one of a carbon element and a silicon element. Such first fiber component member comprising at least one of the carbon element and the silicon element is preferred in terms of tensile strength, which can more effectively contribute to a realization of the piezoelectric fiber that is hard to fracture (or break) with high strength. Moreover, the first fiber component member comprising at least one of the carbon element and the silicon element can facilitate providing an advantageous effect in terms of a process for producing the composite fiber due to a superior heat resistance of the first fiber component member. More specifically, the material comprising at least one of the carbon element and the silicon element in the first fiber component member is less likely to change in its state or does not change in its state even at a high temperature, which can more readily bring about a stabilized process during a ceramic calcination of the second fiber component member. This can facilitate providing a desired fiber as the composite fiber.

For example, the first fiber component member in the composite fiber may be mainly constituted of carbon. As an example, the first fiber component member may be made of carbon based on a graphite bonding. The first fiber component member in the composite fiber may be made of a silicon carbide.

In a preferred embodiment, the first fiber component member is a carbon fiber and/or a SiC fiber (i.e., silicon carbide fiber). The carbon fiber and the SiC fiber both have considerably higher strength property such as tensile strength than that of metals. More specifically, the tensile strength of a metal Ti wire is about 48 kgf/$mm^2$ for example, whereas the tensile strength of the carbon fiber is 500 to 700 kgf/$mm^2$ and the tensile strength of the SiC fiber is 300 kgf/$mm^2$. Accordingly, the first fiber component member (e.g., a plurality of the first sub-fibrous materials) can have more effective action of receiving and bearing the stress to be applied, which can facilitate giving the higher strength in the composite fiber. Further, the carbon fiber hardly undergoes a form change even at a high temperature in a reducing atmosphere. Similarly, the SiC fiber hardly undergoes a form change even at a high temperature in the air as well as in a reducing atmosphere. Accordingly, the carbon fiber and the SiC fiber are facilitated to be stable even when the ceramic of the second fiber component member is calcined. Furthermore, the carbon fiber and the SiC fiber (silicon carbide fibers) particularly have a thermal expansion coefficient which is close to that of ceramics. For example, the thermal expansion coefficient of each of the carbon fiber and the SiC fiber is closer to that of ceramics as compared with metal such as a nickel. These can make it possible for the producing process of the composite fiber to become more desirable. That is, the difference in expansion/contraction between the first fiber component member and the second fiber component member can be suitably reduced when the temperature is raised and lowered through, for example, 1200° C. in association with the ceramic calcination of the second fiber component member, which can make it possible for an undesirable delamination phenomenon to be suitably prevented, which can facilitate producing the desired composite fiber.

There is no particular limitation on the type of the carbon fiber. For example, a PAN-based carbon fiber and/or a pitch-based carbon fiber may be used as the carbon fiber. The PAN-based carbon fiber may be, for example, one obtained by carbonizing a PAN precursor (a polyacrylonitrile fiber). The pitch-based carbon fiber may be, for example, one obtained by carbonizing a pitch precursor (a pitch fiber obtained from a coal tar or a heavy oil of petroleum as a raw material). As such carbon fiber, a commercially available product may be used. The carbon fiber can be a fine or ultrafine member wherein a cross-sectional dimension thereof is 2 to 50 μm, for example 2 to 40 μm, 2 to 30 μm, 2 to 20 μm, 2 to 15 μm, 2 to 10 μm, 2 to 9 μm, 2 to 8 μm, or 2 to 5 μm, which can facilitate contributing to the reduction in the diameter of the composite fiber.

There is also no particular limitation on the type of the SiC fiber. For example, the SiC fiber may be one obtained by a gas-phase decomposition of an organosilicon compound. Alternatively, the SiC fiber may be one obtained by the gas-phase decomposition of a silicon tetrachloride and a hydrocarbon or carbon tetrachloride. Further, the SiC fiber also may be one obtained by thermally oxidizing a silicon-containing polycarbosilane, followed by calcining the resultant. As such SiC fiber, a commercially available product may be used. The SiC fiber also can be a fine or ultrafine member wherein a cross-sectional dimension thereof 2 to 50 μm, for example 2 to 40 μm, 2 to 30 μm, 2 to 20 μm, 2 to 15 μm, 2 to 10 μm, 2 to 9 μm, 2 to 8 μm, or 2 to 5 μm, which can facilitate contributing to the reduction in the diameter of the composite fiber.

In the composite fiber according to the present invention, the first fiber component member can be provided as a fiber member which is high in tensile strength as described above. From another perspective, the first fiber component member can be provided also as a member having a higher specific strength ([gf/D]). For example, the first fiber component member can be one having a specific strength which is higher than that of metal Ti or the like as described above and/or can be one having a specific strength higher than that of a ceramic such as barium titanate. In this regard, the present invention can provide the first fiber component member as a member which is capable of adjusting its resistance (for example, capable of relatively readily adjusting its resistance by an addition of a dopant with respect to a semiconductor material) and also high in specific strength. Further, the first fiber component member can be one which is high in thermal stability, capable of having an adjusted resistance thereof, and also high in specific strength. As such, the composite fiber according to a preferred embodiment of the present invention has the composited semiconductor or metalloid material which is high in thermal stability, capable of having the adjusted resistance, and also high in specific strength.

In a preferred embodiment, the second fiber component member has a ceramic sintered body. That is, the composite fiber may have a sintered body of the ceramic in the second fiber component member combined with the first fiber component member made of the material having the volume resistivity of $5\times10^{6}$ to $5\times10^{6}$ Ω·m or the semiconductor/metalloid. Such ceramic sintered body is preferred at least in that the composite fiber can suitably serve as a ceramic fiber. For example, the ceramic sintered body of the second fiber component member is preferable in terms of the piezoelectric effect of the composite fiber to be used as a piezoelectric fiber. In the present specification, the "ceramic sintered body" can correspond to a ceramic (e.g., a ceramic crystal) formed through a calcination of at least the "ceramic constituent" described below. In other words, the "ceramic constituent" is preferably one that can constitute the "ceramic sintered body". The "ceramic constituent" is also preferably one that can be contained in the "ceramic sintered body".

The is no particular limitation on the "ceramic constituent" (ceramic constituent element) contained in the second fiber component member as long as it is a constituent (element) capable of providing the ceramic (ceramic crystals, in particular in a form of metal oxides). For example, the ceramic constituent is at least one selected from the group consisting of lithium (Li), sodium (Na), potassium (K), magnesium (Mg), calcium (Ca), strontium (Sr), barium (Ba), yttrium (Y), zirconium (Zr), titanium (Ti), vanadium (V), chromium (Cr), manganese (Mn), iron (Fe), cobalt (Co), nickel (Ni), copper (Cu), zinc (Zn), boron (B), aluminum (Al), silicon (Si), indium (In), tin (Sn), antimony (Sb), barium (Ba), tantalum (Ta), tungsten (W), lead (Pb), bismuth (Bi), lanthanum (La), cesium (Ce), neodymium (Nd), samarium (Sm), gadolinium (Gd), dysprosium (Dy), holmium (Ho), erbium (Er), oxygen (O), carbon (C), nitrogen (N), sulfur (S), phosphorus (P), fluorine (F), and chlorine (Cl) (which can be hereinafter referred to as a "ceramic element"). In an exemplary embodiment, the ceramic constituent of the composite fiber may be titanium, barium, and oxygen. In another exemplary embodiment, the ceramic constituent of the composite fiber may be bismuth, sodium, titanium, and oxygen.

The ceramic constituent may include a glass constituent. Examples of the glass constituent include at least one selected from the group consisting of soda lime glass, potash glass, borate glass, borosilicate glass, barium borosilicate glass, zinc borate glass, barium borate glass, bismuth borosilicate glass, bismuth zinc borate glass, bismuth silicate glass, phosphate glass, aluminophosphate glass, and zinc phosphate glass.

In a preferred embodiment, the ceramic of the second fiber component member is one selected from the group consisting of barium titanate, sodium bismuth titanate, and apatite. That is, the composite fiber may have the ceramic material selected from the group consisting of barium titanate, sodium bismuth titanate and apatite as the ceramic of the second fiber component member combined with the first fiber component member made of the material having the volume resistivity of $5\times10^{-6}$ to $5\times10^{6}$ Ω·m or the semiconductor/metalloid. For example, the ceramic barium titanate, the sodium bismuth titanate, and the apatite may be in a form of sintered body. Such ceramic can be obtained through calcination, which can further promote the effect of the present invention. That is, despite of a high temperature process of the calcination, the first fiber component member of the composite fiber according to the present invention can have preferable characteristics for the calcination process in terms of its thermal stability and/or thermal expansion coefficient, and thereby allowing the composite fiber as a ceramic fiber constituted of the ceramic sintered body as described above to be provided more stably and/or with high strength.

The ceramic sintered body may include crystal grains or microcrystals. There is no particular limitation on the size of the crystal grain of the ceramic sintered body. The size of the crystal grain in the ceramic sintered body may be 0.1 μm to 10 μm, for example. In the present specification, the size of crystal grain means the maximum dimension of crystal grain or microcrystal in a cross-sectional view. The ceramic sintered body may be a polycrystalline body of a ceramic (or a ceramic component/constituent).

The size of the crystal grain in the ceramic sintered body may depend on the ceramic component/constituent, and for example, the grain size of the powder of the ceramic constituent before the calcination may be 0.05 μm to 5 μm. The presence of the crystal grains in the composite fiber can be confirmed from an image or the like obtained by photographing a region including a target region using a transmission electron microscope, a scanning electron microscope, a scanning ion microscope or the like. The presence or absence of the crystal grains can be determined by observing a contrast difference due to a difference in the crystal orientation in the image or the like.

For example, in a case where the ceramic of the composite fiber is made of barium titanate, sodium bismuth titanate, or apatite, the second fiber component member may contain the crystal grain(s) or the microcrystal(s) of the barium titanate ($BaTiO_3$) (BT), the sodium bismuth titanate ($(Bi_{1/2}Na_{1/2})TiO_3$) (BNT), or the apatite.

There is no particular limitation on the specific type of the apatite in the second fiber component member as long as it usually belongs to the category of an apatite. In a suitable case where the apatite is used for the composite fiber, the second fiber component member includes an apatite constituent and/or a constituent derived therefrom. The apatite may be a ceramic of a calcium phosphate-based functional inorganic material, and also may be one which contains phosphorus (P) and calcium (Ca) as main elements. In a case where the second fiber component member includes the apatite, the second fiber component member can have specificity in that the ceramic is used for a piezoelectric fiber while the apatite is a ceramic which is usually recognized as a biomaterial. In a preferred embodiment, the apatite in the second fiber component member may be one used as a ceramic-based biomaterial. In a case where the apatite material is used for the second fiber component member as described above, a more suitable ceramic fiber is likely to be provided. For example, when the apatite material is used for the second fiber component member, a high mechanical strength and/or a fracture toughness are facilitated to be imparted to the second fiber component member, and also electronic properties such as generation and control of charge retention ability are facilitated to be suitably imparted to the composite fiber.

For example, the apatite to be used for the second fiber component member may be at least one selected from the group consisting of a fluoroapatite, a chloroapatite, a hydroxyapatite, and an oxyapatite. The fluoroapatite (FAp) is represented by the chemical formula: $Ca_5(PO_4)_3F$ and may also be referred to as a fluorapatite or a fluorapatite. The chloroapatite (CAp) is represented by the chemical formula: $Ca_5(PO_4)_3Cl$, and may also be referred to as a chlorapatite or a chlorapatite. There is no particular limitation on the type of hydroxyapatite (HAp). For example, the hydroxyapatite (HAp) may be one represented by the chemical formula: $Ca_5(PO_4)_3(OH)_2$, and may also be one referred to as "Suisan-Apatite" or "Suisan-Rinkaiseki" in Japanese. The oxyapatite (OHA) may be one represented by the chemical formula: $Ca_5(PO_4)_3O$. As the apatite to be used for the second fiber component member, the hydroxyapatite and/or the oxyapatite is preferred. Accordingly, the second fiber component member may include the hydroxyapatite and/or the oxyapatite or a component/constituent derived therefrom. Such hydroxyapatite and oxyapatite are commonly known as biomaterials. Thus, the composite fiber comprising the hydroxyapatite and/or the oxyapatite is characterized in that a bio-based ceramic is used for the piezoelectric fiber. In the composite fiber, the hydroxyapatite and/or the oxyapatite of the second fiber component member or a component/constituent derived therefrom is likely to impart not only a high mechanical strength and a fracture toughness but also superior electronic properties such as charge retention ability to the composite fiber.

The ceramic of the second fiber component member may be provided as a composite material with a resin. For example, the second fiber component member may be provided by molding a raw material including a ceramic constituent and a resin constituent. The resin means, for example, a polymer material. There is no particular limitation on the kind of the polymer as long as the resin corresponds to the polymer material. As the resin, a thermoplastic resin and/or a thermosetting resin may be appropriately used. For example, a phenol resin, an epoxy resin, a bismaleimide resin, a polypropylene resin, a polyimide resin, a polyamideimide resin, and/or an acrylonitrile resin can be used. Such resin material may be one with one or more hindered amine-based additives or triazine-based additives being blended therein. The ratio of the ceramic to the resin (i.e., ceramic/resin) in the composite material may be, for example, 99/1 to 1/99 on a volume basis. By way of example only, such ratio of "ceramic/resin" may be in the range of 64/36 to 1/99, 30/70 to 1/99, or 20/80 to 1/99.

There is no particular limitation on the cross-sectional dimension of the composite fiber according to the present invention as long as it can be a dimension corresponding to a fiber. That is, the composite fiber according to a preferred embodiment of the present invention has a fiber dimension in a cross-sectional view such that it may have a cross-sectional dimension on the order of μm, for example. For example, the fiber diameter of the composite fiber may be 500 μm or less (especially, 1 μm or more and 500 μm or less). Thus, the fiber diameter of the composite fiber may be 400 μm or less (especially, 1 μm or more and 400 μm or less), 300 μm or less (especially, 1 μm or more and 300 μm or less), 200 μm or less (especially, 1 μm or more and 200 μm or less), and may be 50 μm to 100 μm as one example. In the present invention, the first fiber component member as described above can make it possible to facilitate achieving a diameter reduction (i.e., a size reduction) as compared with the conventional PZT fibers. As used herein, the "fiber diameter" regarding the composite fiber of the present invention means the largest dimension (for example, diameter) in a cross section taken along a direction perpendicular to the axial direction of the fiber.

In the composite fiber according to the present invention, there is no particular limitation on the cross-sectional area ratio of the first fiber component member to the second fiber component member. For example, the value of the area of "the first fiber component member/the area of the second fiber component member" in a cross-sectional view may be 1/99 to 99/1. By way of example only, the cross-sectional area of the first fiber component member/the cross-sectional area of the second fiber component member may be 1/8 to 8/1.

The composite fiber according to the present invention may preferably exhibit an enhanced strength over the conventional PZT fibers. That is, the composite fiber according to the present invention has more suitable strength even while being a ceramic fiber capable of serving as a piezoelectric fiber. As the entire fiber, the composite fiber of the present invention, for example, has the tensile strength (e.g., an elongation load at break) of preferably 5 $kgf/mm^2$ or more, for example, 6 $kgf/mm^2$ or more, 10 $kgf/mm^2$ or more, 14 $kgflmm^2$ or more, or 20 $kgflmm^2$ or more. By way of example only, the tensile strength (e.g., the elongation load at break) of the whole composite fiber according to a preferred embodiment of the present invention is 50 $kgf/mm^2$ or more and 400 $kgflmm^2$ or less.

The composite fiber according to the present invention can be embodied in various embodiments.

(Core-Sheath Structure 1 as Mutual Disposition Mode of First and Second Fiber Component Members)

The composite fiber of the present invention can take various forms as long as the first and second fiber component members satisfy a positional relationship of adjoining to each other. In this regard, the first fiber component member and the second fiber component member may adjoin to each other such that one of them is positioned outside the other of them, as described above. In the cross-sectional view of the composite fiber, the first fiber component member may be at least partially surrounded by the second fiber component member.

Figure 3A:
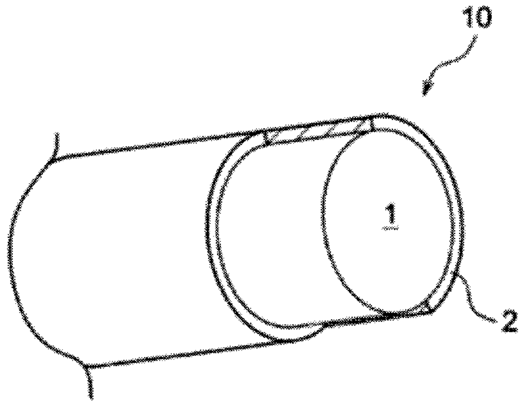
FIGS. 3A and 3B are schematic views schematically illustrating a composite fiber (core-sheath structure 1) according to an embodiment of the present invention
Figure 3B:
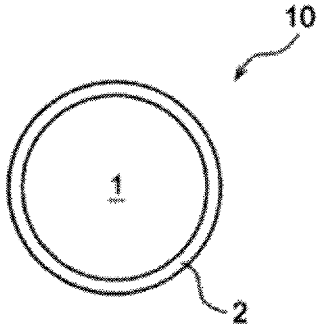

For example, the composite fiber, which is composed of the first and second fiber component members, may have a core-sheath structure. In the exemplary embodiment illustrated in FIGS. 3A and 3B, a core part is provided by the first fiber component member 1, and a sheath part is provided by the second fiber component member 2. In particular, the first fiber component member 1 of the core part occupies a relatively larger cross-sectional area than that of the second fiber component member 2 of the sheath part as in the illustrated embodiment. This makes it possible for the composite fiber's part that effectively takes charge of (e.g., effectively receives and bears) the stress to be applied to have an increased proportion, and thereby allowing the undesirable stress to be less likely to be caused in the second fiber component member upon the application of an external force thereto, will can lead to an achievement of a fracture-proof (or a chip-proof) fiber. That is, the composite fiber serving as a piezoelectric fiber is facilitated to be provided with its high-strength.

(Core-Sheath Structure 2 as Mutual Disposition Mode of First and Second Fiber Component Members)

Figure 4A:
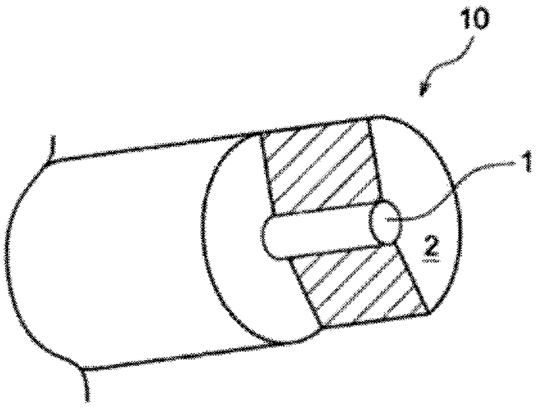
FIGS. 4A and 4B are schematic views schematically illustrating a composite fiber (core-sheath structure 2) according to an embodiment of the present invention
Figure 4B:
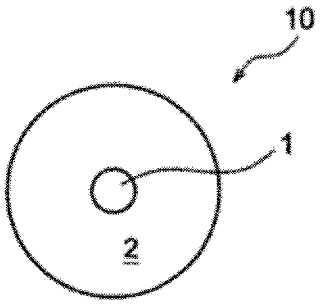

The composite fiber according to the present embodiment has a core-sheath structure in a similar manner to that of the above embodiment, while the second fiber component member 2 of the sheath part occupies a relatively larger cross-sectional area than that of the first fiber component member 1 of the core part (see FIGS. 4A and 4B). That is, as in the exemplary embodiment of FIGS. 4A and 4B, the cross-sectional contour dimension of the first fiber component member 1 provided as the core part is less than half of the cross-sectional contour dimension of the second fiber component member 2 provided as the sheath part (i.e., less than half of the cross-sectional dimension of the whole of composite fiber 10). This can particularly allow the composite fiber to exhibit a more efficient piezoelectric effect as a suitable piezoelectric fiber.

(First Fiber Component Member in Multicore/Fine Fiber Form as Mutual Disposition Mode of First and Second Fiber Component Members)

Figure 5A:
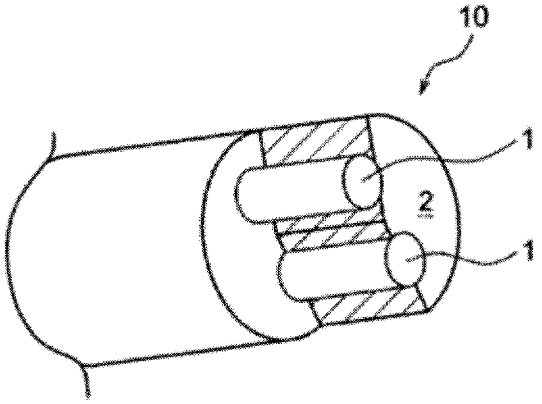
FIGS. 5A and 5B are schematic views schematically illustrating a composite fiber (multiple cores) according to an embodiment of the present invention
Figure 5B:
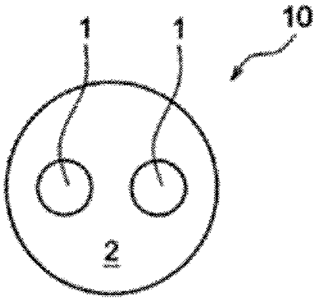
Figure 6A:
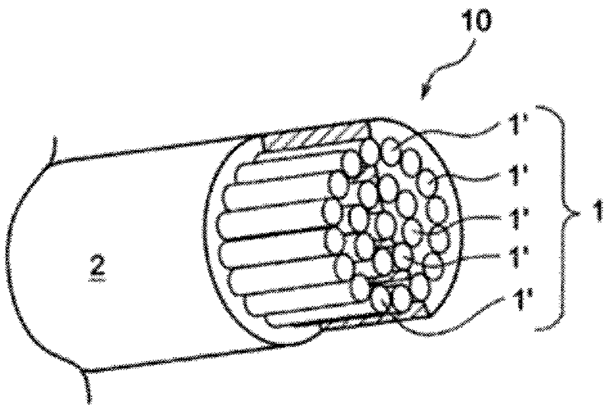
FIGS. 6A and 6B are schematic views schematically illustrating a composite fiber according to an embodiment of the present invention in which a first fiber component member is in a fine form of fiber
Figure 6B:
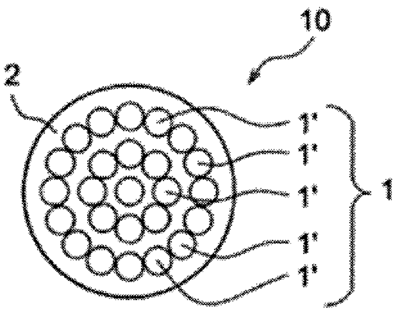

The composite fiber according to this embodiment has the core-sheath structure as described above, while the number of the first fiber component member of the core part is not one but two or more. The composite fiber 10 as illustrated in FIGS. 5A and 5B includes the two fiber component members 1 serving as the core part. The number of the first fiber components serving as the core part is not limited to two, and thus the composite fiber 10 may have a form as illustrated in FIGS. 6A and 6B. Such exemplary embodiment of FIGS. 6A and 6B can be one wherein fine or ultrafine first fiber component members are included. That is, in the embodiment illustrated in FIGS. 6A and 6B, a plurality of first fiber component members 1' each having a fine or ultrafine diameter are provided in the fiber 10. For example, as illustrated in FIGS. 6A and 6B, the sub-fibrous materials 1' as the first fiber component member 1 may be provided in parallel with each other in the fiber region formed by the second fiber component member 2. In such form, a plurality of the first fiber component members (i.e., a plurality of the sub-fibrous materials 1' having the high tensile strength) cooperatively take charge of (e.g., cooperatively receive and bear) the stress to be applied to the composite fiber, and thereby facilitating providing the high-strength piezoelectric fiber.

With respect to the plurality of first fiber component members, various disposition forms thereof in a cross-sectional view are possible. In the present invention, the first fiber component member such as a carbon fiber and/or a SiC fiber can be provided especially as a fine or ultrafine fiber material, and thereby the first fiber component member is facilitated to be provided as taking a plurality of forms in the single composite fiber of the present invention. As illustrated in FIGS. 6A and 6B, a plurality of the first fiber component members (i.e., a plurality of the sub-fibrous materials 1') may have, for example, a symmetrical disposition relationship with each other.

(Biaxial Form as Mutual Disposition Mode of First and Second Fiber Component Members)

Figure 7:
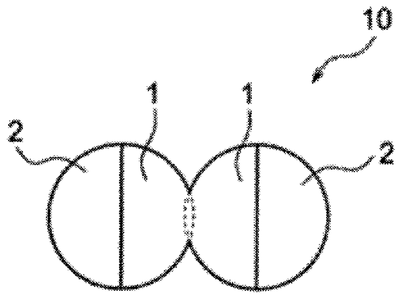
FIG. 7 is a cross-sectional view schematically illustrating a composite fiber having a biaxial form according to an embodiment of the present invention.

The composite fiber according to this embodiment does not have a uniaxial form. For example, the composite fiber 10 as illustrated in FIG. 7 has a two-axes form as a whole fiber.

In such composite fiber 10, one of the first and second fiber component members may be situated relatively outside, and the other of the first and second fiber component members may be situated relatively inside. In the composite fiber 10 illustrated in FIG. 7, the second fiber component member 2 is positioned relatively outside, and the first fiber component member 1 is positioned relatively inside. In other words, the fibrous body is constituted with an adjacent form of the fiber component members in which the first fiber component member 1 and the second fiber component member 2 face each other in one direction orthogonal/perpendicular to the axial direction of the fiber. For example, in an embodiment as illustrated in FIG. 7, a high-strength material such as carbon and/or SiC can be positioned in a fiber region where the tensile/compression of the composite fiber is more likely to be caused. This can facilitate providing a piezoelectric fiber that is strong against bending (for example, left and right bending).

(Doping Embodiment of First Fiber Component Member)

The composite fiber according to this embodiment is such that the first fiber component member is at least partially doped one. For example, in the composite fiber, the first fiber component member including the semiconductor material may be at least partially doped. Since the resistance or the like of the semiconductor material in the first fiber component member can be adjusted by doping (i.e., by an implantation of additives, ions or impurities), a desired composite fiber can be facilitated to be provided in terms of its resistivity and the like. There is no particular limitation on the type of the dopant (i.e., additives, ions or impurities to be implanted). For example, the dopant may be one selected from the group consisting of boron, nitrogen, aluminum, and phosphorus.

In a preferred embodiment, the first fiber component member is at least partially made of the semiconductor such as the N-type semiconductor and/or the P-type semiconductor. For example, the first fiber component member may be at least partially made of the N-type semiconductor or the P-type semiconductor due to the doping with respect to an intrinsic semiconductor.

In a case where the first fiber component member is composed especially of the semiconductor, a dope region (for example, a dope layer) may be present at the interface between the semiconductor of the first fiber component member and the ceramic of the second fiber component member. With this dope region, the composite fiber of the present invention can be provided as a fiber capable of functioning in response to an application of a voltage through the dope layer of the semiconductor or metal at a semiconductor/ceramic interface. In a case of using the dope region (e.g., the dope layer), a gate electrode element, a drain electrode element, a source electrode element and the like may be appropriately provided as related elements.

(Variation Form as Electronic Component Element/Part)

The composite fiber according to this embodiment may have, for example, a structure as illustrated in each of FIGS. 8A to 8D as an electronic component element/electronic part.

Figures 8A, 8B, 8C, 8D:
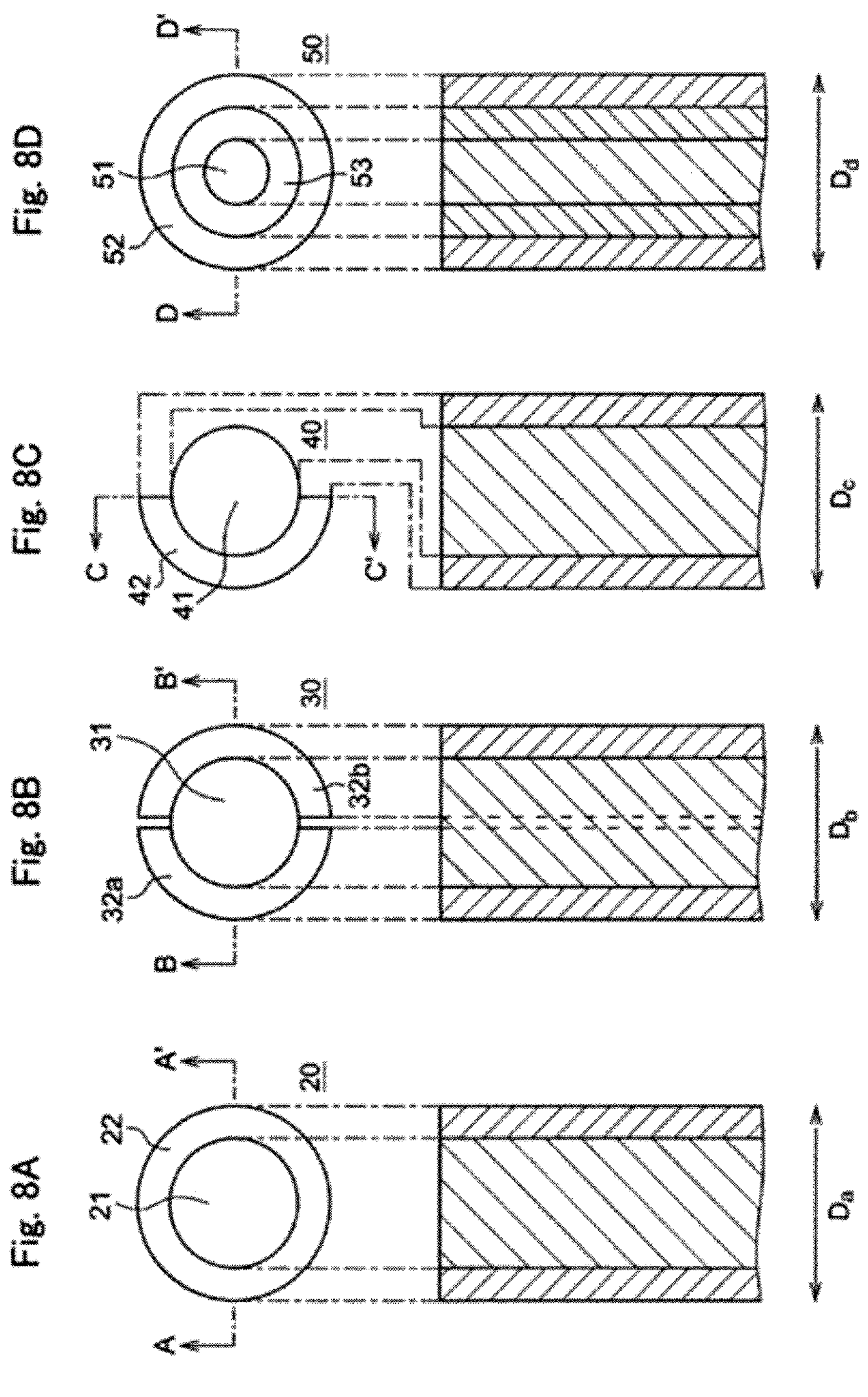
FIGS. 8A to 8D are schematic views schematically illustrating a composite fiber according to an embodiment of the present invention

The composite fiber 20 as illustrated in FIG. 8A has a concentric structure. That is, the composite fiber has a circular cross section, and also has such a structure that the central portion 21 and the outer portion 22 are disposed substantially concentrically. The cross-sectional shapes illustrated in the drawings are circular and concentric, but there is no particular limitation on the cross-sectional shape of the composite fiber.

In the composite fiber 20, one of the central portion 21 and the outer portion 22 forming concentric circles may be one of the "first fiber component member made of a semiconductor/metalloid" and the "second fiber component member made of a ceramic", and the other of the central portion 21 and the outer portion 22 may be the other of the "first fiber component member made of a semiconductor/metalloid" and the "second fiber component member made of a ceramic". In the composite fiber 20, the "first fiber component member made of a semiconductor/metalloid" and the "second fiber component member made of a ceramic" may be in close contact with each other to form an interface therebetween. In FIG. 8A, a fiber diameter $D_a$ (maximum dimension or maximum diameter) shown in this drawing taken along a line A-A' may be, for example, 500 μm or less, and more specifically 1 μm or more and 500 μm or less.

The composite fiber 30 as illustrated in FIG. 8B has a fiber structure in which the outer portion thereof is partially cut. That is, the composite fiber 30 has such a structure that an outer portion 32*a* having a substantially C-shaped (or substantially crescent) cross section and an outer portion 32*b* having a substantially inverted C-shaped (or substantially crescent) cross section (hereinafter, the outer portions 32*a* and 32*b* are collectively referred to as an "outer portion 32") are spaced on a central portion 31 having a substantially circular cross section. The cross-sectional shape of the composite fiber 30 is not particularly limited to the illustrated shape.

In the composite fiber 30, one of the central portion 31 and the outer portion 32 is one of the "first fiber component member made of a semiconductor/metalloid" and the "second fiber component member made of a ceramic", and the other of the central portion 31 and the outer portion 32 is the other of the "first fiber component member made of a semiconductor/metalloid" and the "second fiber component member made of a ceramic". In the composite fiber 30, the "first fiber component member made of a semiconductor/metalloid" and the "second fiber component member made of a ceramic" may be in close contact with each other to form an interface therebetween.

The "semiconductor/metalloid" or "ceramic" of the outer portion 32 may be the same or different in the outer portions 32*a* and 32*b*.

In FIG. 8B, a fiber diameter $D_b$ (maximum dimension or maximum diameter) shown in this drawing taken along a line B-B' may be, for example, 500 μm or less, and more specifically 1 μm or more and 500 μm or less.

The composite fiber 40 as illustrated in FIG. 8C has a fiber structure in which a half of the outer portion thereof is not provided. That is, the composite fiber 40 has such a structure that the outer portion 42 having a substantially C-shaped (or substantially crescent) cross section is disposed on a part of the central portion 41 having a substantially circular cross section. The cross-sectional shape of the composite fiber 40 is not particularly limited to the illustrated shape.

In the composite fiber 40, one of the central portion 41 and the outer portion 42 is one of the "first fiber component member made of a semiconductor/metalloid" and the "second fiber component member made of a ceramic", and the other of the central portion 41 and the outer portion 42 is the other of the "first fiber component member made of a semiconductor/metalloid" and the "second fiber component member made of a ceramic". In the composite fiber 40, the "first fiber component member made of a semiconductor/metalloid" and the "second fiber component member made of a ceramic" may be in close contact with each other to form an interface therebetween.

In FIG. 8C, a fiber diameter $D_c$ (maximum dimension or maximum diameter) shown in this drawing taken along a line C-C' may be, for example, 500 μm or less, and more specifically 1 μm or more and 500 μm or less.

The composite fiber 50 as illustrated in FIG. 8D has a fiber structure with an intermediate layer included therein. That is, the composite fiber 50 has a substantially circular cross section, and also has such a structure that the central portion 51, the outer portion 52, and the intermediate layer 53 positioned therebetween are disposed substantially concentrically. The cross-sectional shape of the composite fiber 50 is not particularly limited to a circular shape or a concentric shape.

In the composite fiber 50, one of the central portion 51 and the outer portion 52 is one of the "first fiber component member made of a semiconductor/metalloid" and the "second fiber component member made of a ceramic", and the other of the central portion 51 and the outer portion 52 is the other of the "first fiber component member made of a semiconductor/metalloid" and the "second fiber component member made of a ceramic". There is no particular limitation on the material of the intermediate layer 53, and it may be constituted of at least one selected from the group consisting of a metal, a ceramic, a metalloid and a semiconductor. In the composite fiber 50, the "first fiber component member made of a semiconductor/metalloid and provided in one of the central portion 51 and the outer portion 52", and the "second fiber component member made of a ceramic and provided in the other of the central portion 51 and the outer portion 52" may be in contact with each other with the intermediate layer 53 interposed therebetween.

In FIG. 8D, a fiber diameter $D_d$ (maximum dimension or maximum diameter) shown in this drawing taken along a line D-D' may be, for example, 500 μm or less, and more specifically 1 μm or more and 500 μm or less.

There is no particular limitation on the method for producing the composite fiber of the present invention, and thus the composite fiber can be produced by making appropriate use of a conventional ceramic calcination technique or the like.

As an example, the composite fiber composed of the integrally adjoining first and second fiber component members can be produced by preparing a paste formed from the above-described "material having a volume resistivity of $5\times10^{-6}$ to $5\times10^{6}$ Ω·m or a semiconductor/metalloid material" optionally together with a sintering aid, a common material, a binder resin, a solvent, a dispersant and/or a plasticizer, and also another paste formed from a raw material including the above-described ceramic constituent (ceramic element) optionally together with a sintering aid, a common material, a binder resin, a solvent, a dispersant and/or a plasticizer (hereinafter, also referred to as a "ceramic raw material paste"), and then appropriately molding them, followed by a calcination (for example, a normal pressure calcination or a pressure calcination). In this regard, each paste may be formed into having a desired shape by use of a multiple nozzle (composite-spinning nozzle such as a double nozzle and a triple nozzle) and/or a forming die, for example.

In a case where the second fiber component member is formed by the calcination as described above, the first fiber component member may also be formed by the calcination, and thus the composite fiber of the present invention may be co-sintered fiber of the "material having a volume resistivity of $1\times10^{-5}$ to $1\times10^{6}$ Ω·m or a semiconductor/metalloid material" and the "ceramic material". In the case of the co-sintered fiber, it is preferred that the second fiber component member has a sintered body, and the first fiber component member also has a sintered body. In this case, an interface formed between the sintered bodies of the first and second fiber component members may be due to crystal grains. In a preferred embodiment, such interface may have a "surface roughness", and thus may be a non-linear interface (alternatively, an interface having a roughness, a line roughness, a surface roughness or irregularities) that is not linear in a cross-sectional view. In other words, the interface between the first fiber component member and the second fiber component member may have a bent line form in a cross-sectional view of the fiber. This interface can effectively contribute to a prevention of delamination between the first fiber component member and the second fiber component member, and/or can contribute to an improvement in strength as the composite fiber.

In a case where the first fiber component member in the composite fiber is made of, for example, a fiber such as a carbon fiber and/or a SiC fiber, a commercially available carbon fiber and/or SiC fiber may be used. That is, the desired composite fiber can be provided by appropriately combining such carbon fiber and/or SiC fiber with the ceramic raw material paste, followed by the calcination thereof. Alternatively, the desired composite fiber can be provided by combining such carbon fiber and/or SiC fiber with a resin raw material including a ceramic constituent, followed by a molding thereof or the like.

Although some embodiments of the present invention have been hereinbefore described, they are only for illustrative purpose regarding the typical ones just as an example. The composite fiber according to the present invention is not limited to these embodiments. It would be readily appreciated by those skilled in the art that various changes could be made in the above without departing from the scope of the disclosure.

Figure 9:
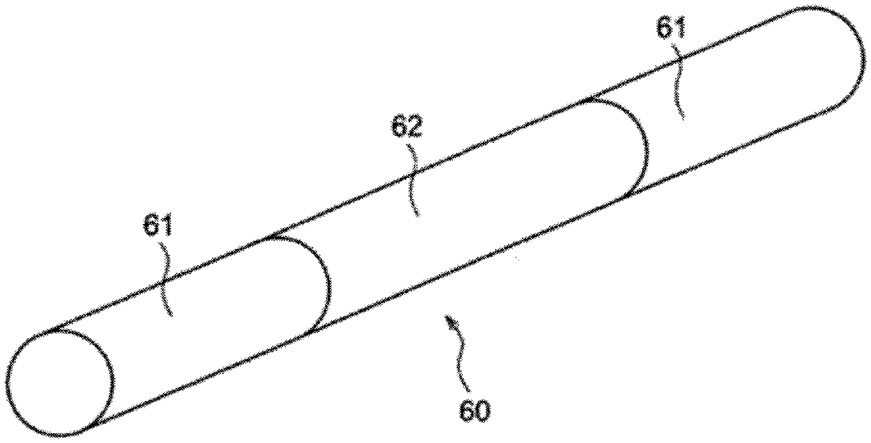
FIG. 9 is a perspective view schematically illustrating a composite fiber according to an embodiment of the present invention, which also illustrates an embodiment wherein a first fiber component member and a second fiber component member are adjacent to each other in the direction of a fiber axis.

For example, in the above description, the drawings in which the first fiber component member and the second fiber component member adjoin to each other particularly in the radial/diameter direction of the composite fiber are made reference to, but the present invention is not necessarily limited thereto. The composite fiber may have such a structure that the first fiber component member and the second fiber component member are adjacent to each other to be aligned with each other in the axial direction of the fiber. In the composite fiber 60 as illustrated in FIG. 9, the first fiber component member 61 and the second fiber component member 62 are combined in contact with each other to be aligned in the axial direction of the fiber.

Figure 10:
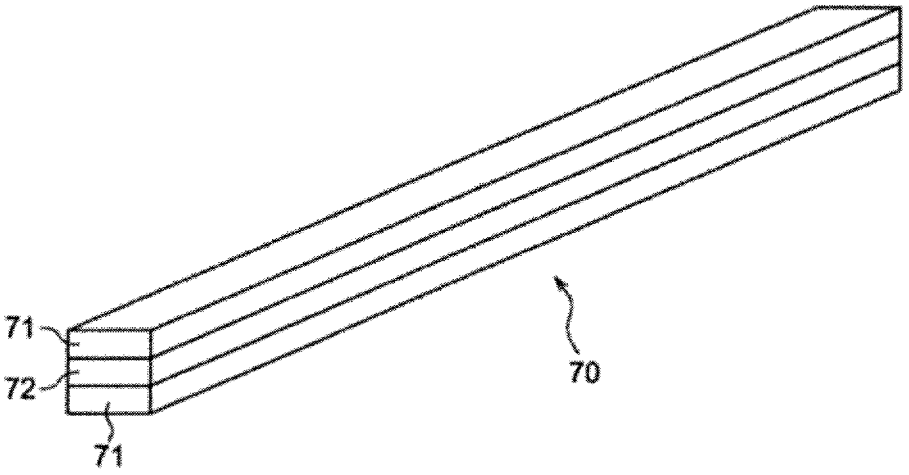
FIG. 10 is a perspective view schematically illustrating a composite fiber according to an embodiment of the present invention, which also illustrates an embodiment wherein the composite fiber has a sandwich structure.
Figure 11A:
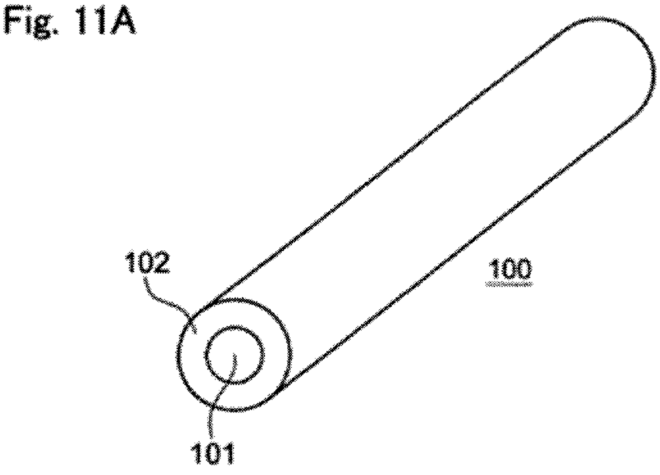
FIGS. 11A, 11B, and 11C are schematic views schematically illustrating a conventional PZT fiber and a smart board with the PZT fiber being embedded in a structure thereof.
Figure 11B:
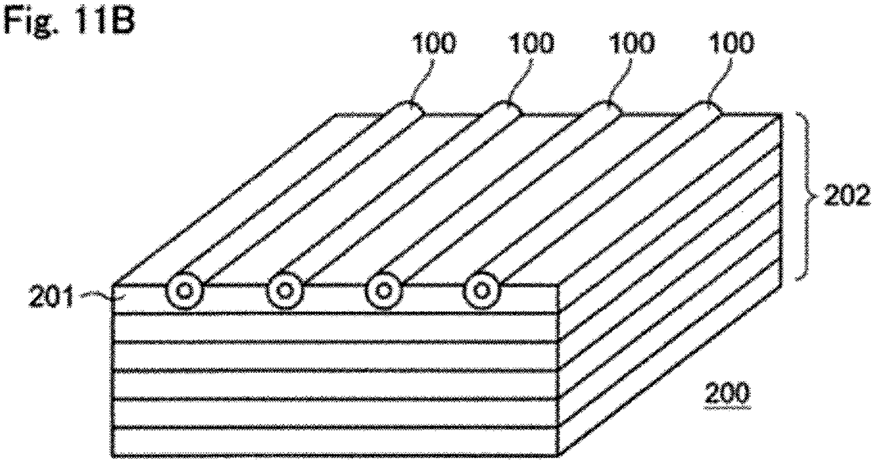
Figure 11C:
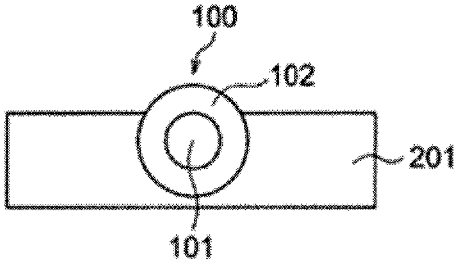
Figure 12:
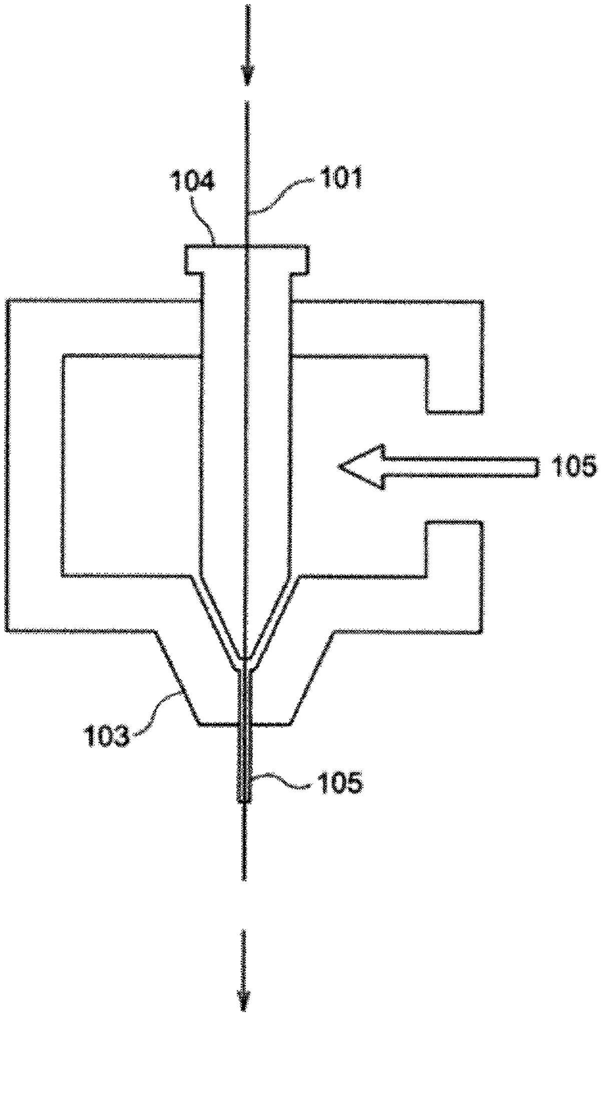
FIG. 12 is a schematic view schematically illustrating an example of a method for producing a conventional PZT fiber.
Figure 13A:
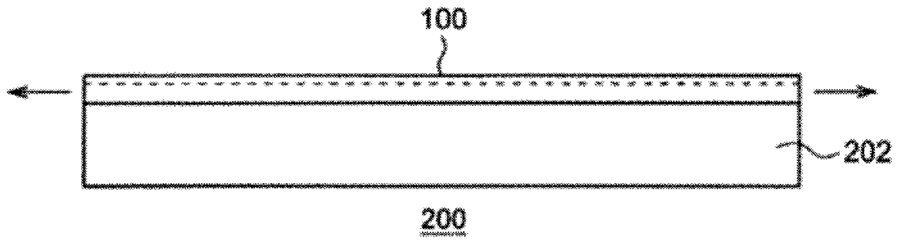
FIGS. 13A and 13B are schematic views schematically illustrating cases where a conventional smart board is used as a vibration sensor and an actuator.
Figure 13B:
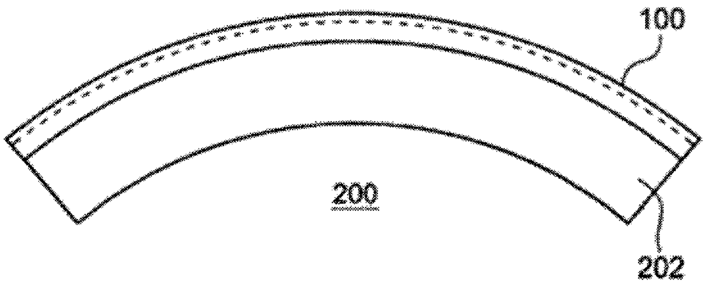

In the above description, some of the drawings in which the composite fiber has the concentric structure are made reference to, but the present invention is not necessarily limited thereto. The composite fiber may have a sandwich structure. That is, one of the first fiber component member and the second fiber component member may be sandwiched by the other. The composite fiber 70 as illustrated in FIG. 10 has such a form that the second fiber component member 72 made of the ceramic is sandwiched between the first fiber component members 71 made of the semiconductor/metalloid. Such composite fiber may have a rectangular shape or a square shape in a cross-sectional view as illustrated in FIG. 10.

Furthermore, the first fiber component member and the second fiber component member in the composite fiber according to the present invention may be specialized only for the semiconductor/metalloid material and the ceramic material. That is, in the composite fiber according to a preferred embodiment of the present invention, the first fiber component member may consist only of the semiconductor or metalloid material, and the second fiber component member may consist only of the ceramic material. Nevertheless, the first fiber component member and the second fiber component member in the present invention allow the presence of an unavoidable or accidental constituent (i.e., unavoidable or accidental constituent element and/or constituent material) that can be unavoidably or accidentally incorporated at the time of forming the members and/or producing the composite fiber (e.g., trace or ultra-trace amount of the unavoidable or accidental component, etc.).

It should be noted that the present invention as described above includes the following aspects:

The first aspect: A composite fiber comprising:

a first fiber component member constituted of a material having a volume resistivity of $5\times10^{-6}$ to $5\times10^{6}$ Ω·m; and a second fiber component member comprising a ceramic material, wherein the first fiber component member and the second fiber component member are adjacent to each other such that the first and second fiber component members form a fibrous body.

The second aspect: A composite fiber comprising:

a first fiber component member comprising a material of a semiconductor or metalloid; and a second fiber component member comprising a ceramic material, wherein the first fiber component member and the second fiber component member are adjacent to each other such that the first and second fiber component members form a fibrous body.

The third aspect: The composite fiber according to the first or second aspect, wherein the first and second fiber component members are adjacent to each other such that one of the first and second fiber component members is situated outside the other of the first and second fiber component members.

The fourth aspect: The composite fiber according to any one of the first to third aspects, wherein, in a cross-sectional view of the composite fiber, the first fiber component member is at least partially surrounded by the second fiber component member.

The fifth aspect: The composite fiber according to any one of the first to fourth aspects, wherein the first fiber component member is composed of a plurality of sub-fiber component members.

The sixth aspect: The composite fiber according to the fifth aspect, wherein, in a cross-sectional view of the composite fiber, the plurality of sub-fiber component members are disposed within a contour region of the second fiber component member.

The seventh aspect: The composite fiber according to any one of the first to sixth aspects, wherein the first fiber component member has a tensile strength of 100 kgf/mm$^2$ or more/higher.

The eighth aspect: The composite fiber according to any one of the first to seventh aspects, wherein the first fiber component member has a tensile strength of 200 kgf/mm$^2$ or more/higher.

The ninth aspect: The composite fiber according to any one of the first to eighth aspects, wherein the material of the first fiber component member comprises a carbon and/or a silicon.

The tenth aspect: The composite fiber according to any one of the first to ninth aspects, wherein the first fiber component member is at least partially doped member.

The eleventh aspect: The composite fiber according to any one of the first to tenth aspects, wherein the second fiber component member comprises a ceramic sintered body.

The twelfth aspect: The composite fiber according to any one of the first to eleventh aspects, wherein a ceramic constituent of the ceramic material is at least one selected from a group consisting of lithium (Li), sodium (Na), potassium (K), magnesium (Mg), calcium (Ca), strontium (Sr), barium (Ba), yttrium (Y), zirconium (Zr), titanium (Ti), vanadium (V), chromium (Cr), manganese (Mn), iron (Fe), cobalt (Co), nickel (Ni), copper (Cu), zinc (Zn), boron (B), aluminum (Al), silicon (Si), indium (In), tin (Sn), antimony (Sb), barium (Ba), tantalum (Ta), tungsten (W), lead (Pb), bismuth (Bi), lanthanum (La), cesium (Ce), neodymium (Nd), samarium (Sm), gadolinium (Gd), dysprosium (Dy), holmium (Ho), erbium (Er), oxygen (0), carbon (C), nitrogen (N), sulfur (S), phosphorus (P), fluorine (F), and chlorine (Cl). The thirteenth aspect: The composite fiber according to any one of the first to twelfth aspects, wherein the ceramic material is one selected from a group consisting of a barium titanate, a sodium bismuth titanate (bismuth sodium titanate), and an apatite.

INDUSTRIAL APPLICABILITY

The composite fiber according to the present invention can be utilized as various piezoelectric fibers. The composite fiber according to the present invention can also be utilized as a fiber-shaped electronic component element/electronic part, and the like. By way of example only, the composite fiber of the present invention can be utilized for a sensor, especially a vibration sensor, an actuator or the like to be used in a structure such as a building, an automobile, a ship and/or an aircraft.

DESCRIPTION OF REFERENCE NUMERALS

1: First fiber component member
1': Sub-fiber component member (sub-fibrous material of first fiber component member)
2: Second fiber component member
10, 20, 30, 40, 50, 60, 70: Composite fiber
21, 31, 41, 51: Central portion
22, 32, 42, 52: Outer portion
53: Intermediate portion
61: First fiber component member
62: Second fiber component member
71: First fiber component member
72: Second fiber component member
100: PZT fiber
101: Metal wire/Thin metal wire
102: PZT thin layer/PZT film
103: Nozzle
104: Wire guide
105: PZT paste
200: Smart board
201: Carbon fiber reinforced plastic (CFRP) prepreg
202: Structure

What is claimed is:

1. A composite fiber comprising:

a first fiber component member comprising a material of a semiconductor or metalloid;

a second fiber component member comprising a ceramic sintered body; and an intermediate layer between the first fiber component member and the second fiber component member, wherein a material of the intermediate layer is at least one selected from a metal, a ceramic, a metalloid and a semiconductor, wherein the first fiber component member and the second fiber component member are in contact with each other via the intermediate layer such that the first and second fiber component members form a fibrous body, and wherein the first fiber component member has a tensile strength and/or elastic modulus that is higher than that of the second fiber component member, wherein a ceramic material of the ceramic sintered body is one selected from a group consisting of a barium titanate, a sodium bismuth titanate, and an apatite.

2. The composite fiber according to claim 1, wherein the tensile strength of the first fiber component member is 100 kgf/mm$^2$ to 20000 kgf/mm$^2$.

3. The composite fiber according to claim 1, wherein the tensile strength of the first fiber component member is 200 kgf/mm$^2$ to 20000 kgf/mm$^2$.

4. The composite fiber according to claim 1, wherein, in a cross-sectional view of the composite fiber, the first fiber component member is at least partially surrounded by the second fiber component member.

5. The composite fiber according to claim 1, wherein the first fiber component member is composed of a plurality of sub-fiber component members.

6. The composite fiber according to claim 5, wherein, in a cross-sectional view of the composite fiber, the plurality of sub-fiber component members are disposed within a contour region of the second fiber component member.

7. The composite fiber according to claim 1, wherein the tensile strength of the first fiber component member is 100 kgf/mm$^2$ or more.

8. The composite fiber according to claim 1, wherein the first fiber component member is at least a partially doped member.

9. The composite fiber according to claim 1, wherein a ceramic constituent of the ceramic material is at least one selected from a group consisting of lithium (Li), sodium (Na), potassium (K), magnesium (Mg), calcium (Ca), strontium (Sr), barium (Ba), yttrium (Y), zirconium (Zr), titanium (Ti), vanadium (V), chromium (Cr), manganese (Mn), iron (Fe), cobalt (Co), nickel (Ni), copper (Cu), zinc (Zn), boron (B), aluminum (Al), silicon (Si), indium (In), tin (Sn), antimony (Sb), barium (Ba), tantalum (Ta), tungsten (W), lead (Pb), bismuth (Bi), lanthanum (La), cesium (Ce), neodymium (Nd), samarium (Sm), gadolinium (Gd), dysprosium (Dy), holmium (Ho), erbium (Er), oxygen (O), carbon (C), nitrogen (N), sulfur(S), phosphorus (P), fluorine (F), and chlorine (Cl).

* * * * *